Nov. 22, 1960 A. ESCHNER, JR 2,961,613

LINEAR FREQUENCY DISCRIMINATOR

Filed Jan. 19, 1956 2 Sheets-Sheet 1

INVENTOR.
ALBERT ESCHNER, JR.,
BY
ATTORNEY.

Nov. 22, 1960 A. ESCHNER, JR 2,961,613

LINEAR FREQUENCY DISCRIMINATOR

Filed Jan. 19, 1956 2 Sheets-Sheet 2

INVENTOR.
ALBERT ESCHNER, JR.,
BY
[signature]
ATTORNEY.

United States Patent Office 2,961,613

Patented Nov. 22, 1960

2,961,613

LINEAR FREQUENCY DISCRIMINATOR

Albert Eschner, Jr., Culver City, Calif., assignor to Hughes Aircraft Company, Culver City, Calif., a corporation of Delaware Filed Jan. 19, 1956, Ser. No. 560,925

8 Claims. (Cl. 329—137)

The present invention relates to frequency demodulators, and more particularly to a frequency discriminator whose output signal is a linear function of the frequency of an applied input signal for frequencies from substantially direct current to twice a predetermined center or cross-over frequency.

One typical class of frequency discriminators of the prior art includes a high-pass filter and a low-pass filter to which the signals to be detected are applied, a pair of amplitude detectors connected to the output of each of the filters and a subtractor or adder circuit for combining the outputs of the two amplitude detectors. A typical response curve for such a discriminator will be found to be either non-linear or of restricted range. In addition, the manufacture of such a discriminator for operation in the audio frequency range, according to conventional techniques where inductor-capacitor filters are used, results in a discriminator which is both heavy and bulky.

It is therefore an object of the present invention to provide a frequency discriminator which has a linear response for frequencies from substantially direct current to twice a predetermined center or cross-over frequency, and, accordingly, one having a linear response over a range of frequencies not heretofore achieved in the art.

A further object of the present invention is to provide a linear frequency discriminator utilizing resistor-capacitor filters, rather than inductor-capacitor filters, and, accordingly, one which may be easily fabricated of relatively light and compact components.

Another object of the present invention is to provide a linear frequency discriminator utilizing filter sections whose design parameters may be easily determined and whose response closely corresponds to that for which the discriminator is designed without resort to complex tuning operations.

A frequency discriminator, according to the present invention, comprises a high-pass filter and a low-pass filter for receiving the input signals to be detected; a pair of amplitude detectors connected to the output of each of the filters and a summing circuit for combining the output signals from the amplitude detectors to produce the output signal of the discriminator. The input signal applied to the frequency discriminator may be a sine wave, the frequency of which is subject to variation, a frequency-modulated carrier wave, or a noise signal, or any other signal to be frequency detected.

According to the present invention, the high-pass and low-pass filters are mechanized by means of resistor-capacitor high and low-pass filters, in which case, a substantially linear response over a frequency range from D.C. to twice a predetermined center frequency may be achieved by including an attenuator network in the low-pass filter input circuit. As taught in the present invention the "center frequency" is a frequency which provides substantially equal output of the high and low pass filters and consequently the discriminator output is zero and independent of the input signal amplitude at such frequency.

The novel features which are believed to be characteristic of the invention, both as to its organization and method of operation, together with further objects and advantages thereof, will be better understood from the following description considered in connection with the accompanying drawings in which a number of embodiments of the invention are illustrated by way of example. It is to be expressly understood, however, that the drawings are for the purpose of illustration and description only, and are not intended as a definition of the limits of the invention.

Figure 1:
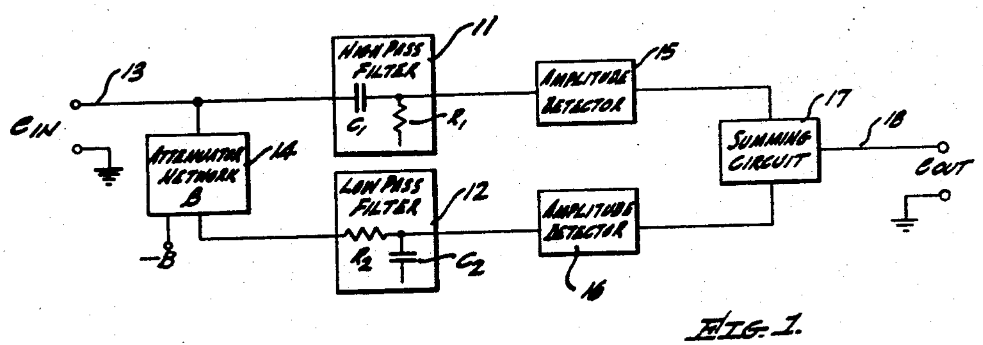
Fig. 1 is a block diagram of a frequency discriminator, according to the present invention.

Referring now to the drawings wherein like reference characters refer to similar elements in the several views, and particularly to Fig. 1 a frequency discriminator, according to the present invention, comprises a high-pass filter 11 and a low-pass filter 12 for receiving input signals applied to the discriminator over an input lead 13. High-pass filter 11 is arranged to receive input signals directly from input 13, while low-pass filter 12 is arranged to receive input signals from input 13 through an attenuator network 14 which is connected to a source of negative potential —B. The output terminals of each of filters 11 and 12 are connected to the input terminals respectively of a pair of amplitude detectors 15 and 16, while the output terminals of the amplitude detectors are connected to a summing circuit 17. The output terminal 18 of summing circuit 17 serves as the output terminal for the frequency discriminator.

More particularly, each of filters 11 and 12 is a resistor-capacitor filter network which may, as shown in Fig. 1, be represented for high-pass filter 11 as an RC differentiating circuit comprising a capacitor $C_1$ and a resistor $R_1$, and for low-pass filter 12 as an RC integrating circuit comprising a capacitor $C_2$ and resistor $R_2$. While each of filters 11 and 12 may include a plurality of RC sections for developing the frequency response desired, it has been found that single section filters are ideally suited to achieving the desired results of the present invention and, accordingly, the design parameters to be derived hereinafter are based on single section filters. High-pass filter 11 is connected to receive input signals directly from input lead 13, while the signals applied to low-pass filter 12 are arranged to pass through attenuator network 14, which, according to the present invention, is arranged to provide that the signals received by filter 12 have an amplitude which is a specific fraction of the amplitude of the signals applied to high-pass filter 11. This fraction, which will hereinafter be referred to as the attenuation constant $\beta$ should be constant over the entire frequency band of the discriminator. Alternatively, an amplifier stage having a predetermined gain may be interposed between input lead 13 and high-pass filter 11 to provide a similar ratio between the signals applied to the filter sections, attenuator network 14 being omitted in such a case.

Amplitude detectors 15 and 16, which receive their input signals from filters 11 and 12, respectively, may be conventional amplitude detectors of half or full wave rectifier design and may, where summing circuit 17 is arranged as an adder circuit, be poled to provide output signals of opposite polarity for the same input wave, Alternatively, where summing circuit 17 is mechanized to function as a subtractor and produce a signal representing the difference of its applied input signals, detectors 15 and 16 should be poled to provide output signals of the same polarity for applied input signals. The time constants of the filters associated with each of detectors 15 and 16 should be such as to remove frequency components of the applied input signals not desired in the output of the discriminator. Summing circuit 17 may comprise a simple network of resistors for summing the outputs of each of detectors 15 and 16 and producing an output signal proportionally corresponding thereto on its output terminal 18. Alternatively, the summing circuit may comprise a differencing or summing amplifier where desired.

Figure 2:
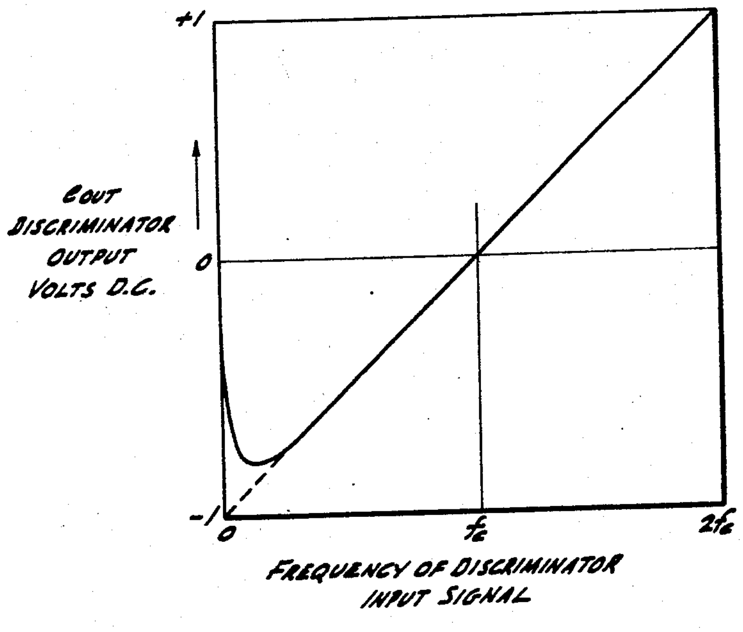
Fig. 2 is a diagram illustrating the response of the circuit of Fig. 1 to signals of various frequencies.

As shown in Fig. 2, the frequency discriminator of Fig. 1 may be designed by appropriate choice of the parameters of filters 11 and 12 and attenuator network 14 to have a substantially zero output signal at a center frequency designated $f_c$, negative output signals at frequencies less than $f_c$ and positive output signals for frequencies greater than $f_c$. By appropriate choice of these circuit parameters, it may be further provided that the output signals for signals having a frequency other than frequency $f_c$ are substantially linearly proportional to the frequency deviation from center frequency $f_c$, and that this relationship of linearity of response extend from substantially zero frequency or direct current to a frequency twice $f_c$. Equations descriptive of the design parameters necessary for achieving such a response will now be defined.

If filters 11 and 12 comprise single section RC- differentiating and integrating networks, respectively, the ratio of output to input signal amplitudes for a steady state sine wave signal applied to high-pass filter 11 will be $$|Y_1| = \frac{1}{\sqrt{1+\frac{1}{\omega^2 T_1^2}}} \qquad (1)$$

and the corresponding ratio for the same signals applied to low-pass filter 12 will be $$|Y_2| = \frac{1}{\sqrt{1+\omega^2 T_2^2}} \qquad (2)$$

wherein $\omega = 2\pi f$, $f$ being the frequency of the applied sine wave signal: $T_1 = R_1 C_1$, the time constant of filter 11; $T_2 = R_2 C_2$, the time constant of filter 12.

Where the output impedance of the source driving each of filters 11 and 12 is not zero, the values of each of $R_1$ and $R_2$ should be appropriately modified to include such impedance in the filter time constants.

If the input signal applied to low-pass filter 12 is a fraction $\beta$ of the signal applied to high-pass filter 11, then the output-input ratio corresponding to Equation 2 for filter 12 will become $$|Y_2| = \frac{\beta}{\sqrt{1+\omega^2 T_2^2}} \qquad (3)$$

If it is assumed that each of amplitude detectors 15 and 16 and summing circuit 17 give output signals independent of the frequency of the applied input signals, then the output signal from the discriminator for an input sine wave of unity amplitude applied to lead 13 may be expressed, by combining Equations 1 and 3 as $$e_o = |Y_1| - |Y_2| = \frac{1}{\sqrt{1+\frac{1}{\omega_2 T_1^2}}} - \frac{\beta}{\sqrt{1+\omega^2 T_2^2}} \qquad (4)$$

where $e_0$ is the output signal and the other symbols have the significance heretofore noted.

The discriminator output must be zero and independent of the input signal amplitude at the cross-over or center frequency, $f_c$. This condition may be satisfied by substituting $\omega_c$ (which is equal to $2\pi f_c$) in Equation 4 and setting the equation equal to zero. The resulting equation may then be solved to yield $$T_1^2 = \frac{\beta^2}{\omega_c^2(\omega_c^2 T_2^2 + 1 - \beta^2)} \qquad (5)$$

If the discriminator is to have a linear input-output curve between zero and twice the cross-over or center frequency, then the value of the right-hand member of Equation 4 at zero frequency must be equal to and of opposite sign than the value of the equation at $\omega = 2\omega_c$, that is $$\beta = \frac{1}{\sqrt{1+\frac{1}{4\omega_c^2 T_1^3}}} - \frac{\beta}{\sqrt{1+4\omega_c^2 T_2^2}} \qquad (6)$$

Equations 5 and 6 may be combined to yield $$\frac{2}{\sqrt{\omega_c^2 T_2^2 + 1 + 3\beta^2}} - \frac{1}{\sqrt{4\omega_c^2 T_2^2 + 1}} = 1 \qquad (7)$$

which may be taken, together with Equation 5 as the design equation for the parameters $T_1$, $T_2$, and $\beta$ of the discriminator of the present invention.

It may be shown that the maximum value of $\beta$ which yields real roots for Equation 7 is approximately 1/5, and that the corresponding value of $\omega_c^2 T_2^2 = .33$, and of $\omega_c^2 T_1^2 = .031$. Accordingly, a useful solution of Equations 7 and 5 is $$\beta = .2 \qquad (8)$$

$$T_1 = \frac{\sqrt{.031}}{\omega_c} \qquad (9)$$

$$T_2 = \frac{\sqrt{.33}}{\omega_c} \qquad (10)$$

The discriminator circuit shown in Fig. 3 and described more fully hereinafter was designed to have a center frequency of one kilocycle, and accordingly the time constants, as determined by Equations 9 and 10 are $T_1 = 28$ microseconds $T_2 = 91$ microseconds It should be noted that the choice of the maximum value of $\beta$ in the solution of Equation 7 is based on the desirability of achieving maximum gain (or minimum loss) through the discriminator, and that smaller values of $\beta$ may yield useful solutions of the equation which display the desired linearity of response over the same frequency range as that for $\beta = 1/5$.

Figure 3:
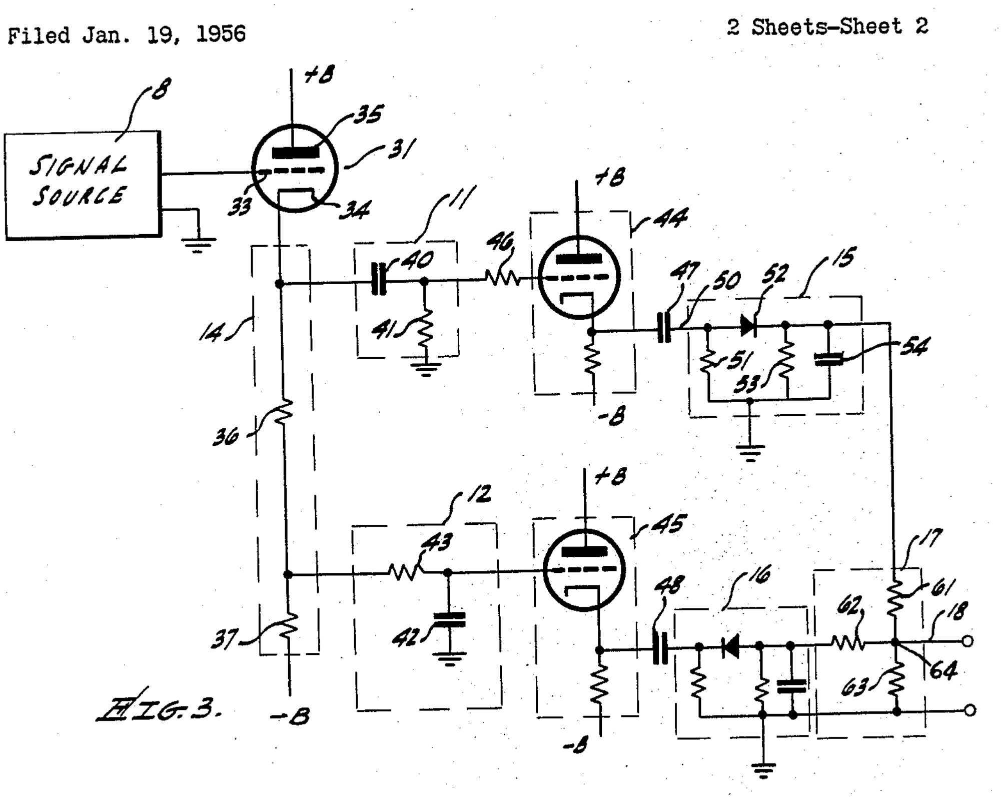
Fig. 3 is a circuit diagram of one embodiment of the present invention, according to the block diagram of Fig. 1.

Referring now to Fig. 3, there is shown a circuit diagram of an embodiment of the present invention arranged in accordance with Fig. 1. As shown in the figure, the embodiment includes all of the elements shown and described in Fig. 1, and, in addition, a plurality of cathode follower stages for effecting isolation between serially connected elements of the discriminator. More particularly, the frequency discriminator of Fig. 3 comprises a source 8 of signals to be detected which is arranged to apply an input signal to high-pass filter 11 through a cathode follower stage 31 and to low-pass filter 12 through cathode follower stage 31 and the attenuator network 14. Cathode follower stage 31 comprises a triode electron discharge device having a grid 33, a cathode 34 and plate 35. Plate 35 is connected directly to a source of positive potential +B, while cathode 34 is connected to high-pass filter 11 and through attenuator network 14 to a source of negative potential −B. The signals from source 8 may be applied directly to grid 33.

Attenuator network 14 comprises a pair of serially connected resistors 36 and 37 interconnecting cathode 34 and the negative source of potential −B. The attenuator will thus be seen to function as the load resistor for cathode follower stage 31, and accordingly, resistors 36 and 37 should be arranged to have a total resistance corresponding to the desired load resistance for the stage. While high-pass filter 11 has its input signal developed across the entire attenuator network, low-pass filter 12 has its input connected to the common point of serially connected resistors 36 and 37, and accordingly receives a fraction of the input signal applied to high-pass filter 11, the fraction corresponding to the value of resistor 37 divided by the value of the sum of resistors 36 and 37. When connected in this manner it will readily be recognized that attenuator 14 operates to carry out the attenuation function required and applies to low-pass filter 12 a fraction $\beta$ of the input signal applied to high-pass filter 11.

High-pass filter 11 comprises a capacitor 40 and a resistor 41 connected to ground and arranged as a conventional RC differentiating circuit, while low-pass filter 12 comprises a capacitor 42 connected to ground and a resistor 43 arranged as a conventional RC integrating circuit. The output terminal of each of filters 11 and 12 is connected to a cathode follower stage 44 and 45 respectively, a resistor 46 being included in the input circuit of cathode follower stage 44 to prevent parasitic oscillations. Each of cathode follower stages 44 and 45, may be arranged as conventional cathode followers as depicted, and function to prevent the loading of filters 11 and 12 by amplitude detectors 15 and 16. Each of amplitude detectors 15, 16, is a conventional half-wave detecting circuit and is connected to receive its input signal from cathode follower stages 44 and 45 through a pair of coupling capacitors 47 and 48. Each detector includes, as shown for example for detector 15, an input lead 50 for receiving an applied input signal, a load resistor 51 interconnecting the input lead and ground across which the input signal is developed and a serially connected diode 52 and load resistor 53 interconnecting input lead 50 and ground, the output signals from the detector being developed across load resistor 53. In addition, a filtering capacitor 54 is connected across load resistor 53 to effect the smoothing of output signals from the detector and remove frequency components not desired in the output signal.

Summing circuit 17 is arranged as a resistive summing circuit, and, accordingly, the diodes in each of detectors 15 and 16 should be poled to produce signals of opposite polarity for the same applied input signal. Summing circuit 17 comprises a pair of resistors 61 and 62 each having a first end connected to the output terminals of detectors 15 and 16, respectively, and their second ends connected together at a common point 64. A third resistor 63 is connected between the common point 64 and ground. Output signals from the summing circuit may be taken between the common point 64 of the three resistors and ground.

The response of the circuit shown and described in Fig. 3 has been found to correspond within an experimental error to the response curve shown in Fig. 2. A typical discriminator constructed in accordance with the present invention for a center frequency of 1000 cycles utilized the following circuit values for the various elements of Fig. 3:

| | |
|---|---|
| Resistor 36 | 24,000 ohms. |
| Resistor 37 | 6,000 ohms ($\beta$=.2). |
| Capacitor 40 | 1,000 microfarads. |
| Resistor 41 | 28,000 ohms. |
| Capacitor 42 | 1,000 microfarads. |
| Resistor 43 | 86,000 ohms. |
| Resistors 61, 62, 63 | 1 meg. |

The resulting discriminator has a center frequency of 1000 cycles and has a substantially linear response from approximately 100 cycles to approximately 2000 cycles.

The discriminator shown and described in Fig. 3 will not produce output signals in response to applied direct current signals, and, accordingly, does not, in fact, have a response extending to zero frequency. The failure to achieve such a response may be attributed to the presence of coupling capacitors 47 and 48, which effectively block D.C. signals presented by the cathode followers from each of detectors 15 and 16, while at the same time affording substantially negligible impedance to alternating current signals. Capacitors 47 and 48 have been included in the circuit of Fig. 3 in order to make it unnecessary to balance the outputs of cathode follower stages 44 and 45 for D.C. signals. However, where D.C. response of the discriminator is desired, capacitors 47 and 48 may be omitted, in which case cathode follower stages 44 and 45 may be adjusted by appropriate variation of their circuit parameters to have corresponding direct current potentials at their respective output terminals. The resulting discriminator will be found to function over the desired extended frequency range.

Figure 4:
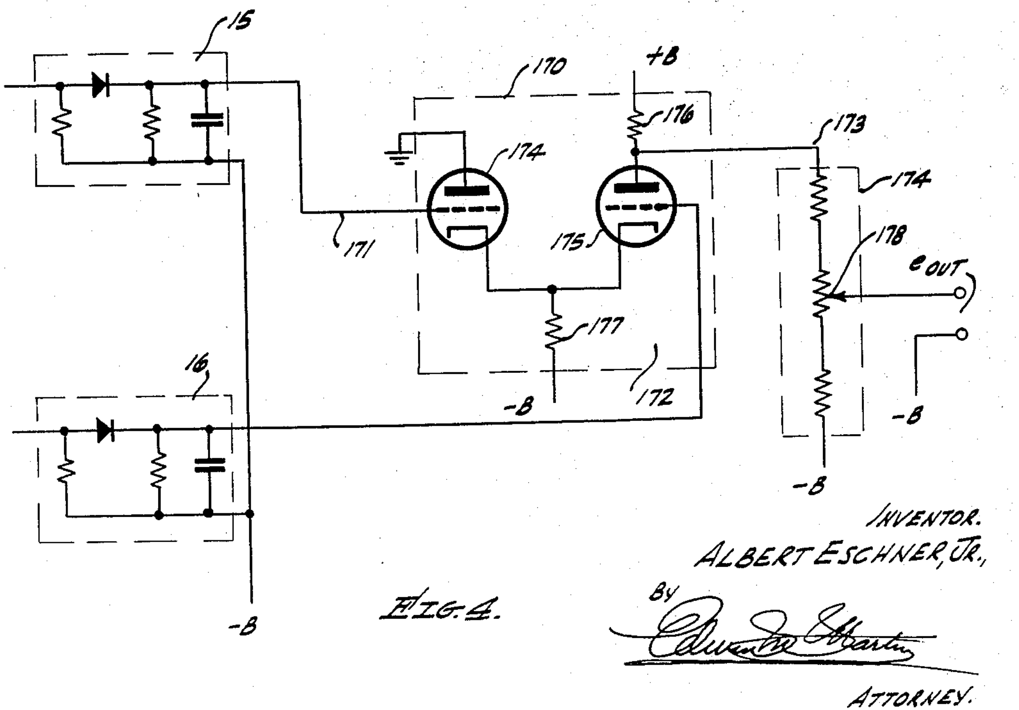
Fig. 4 is a circuit diagram of another embodiment of the present invention, according to Fig. 1.

While the discriminator of the present invention as described utilizes selected typical circuits of the prior art, it will be readily recognized that other circuits substantially equivalent may be readily substituted for those shown and described without departing from the scope and intent of the present invention. For example, where output signals of greater amplitude are desired, summing network 17 may be replaced by a differential amplifier stage adapted to display gain over the entire range of input signals. Such an embodiment of the present invention is shown in Fig. 4, wherein summing network 17 has been replaced by a differential amplifier 170. The embodiment includes all of the elements shown and described in connection with Fig. 3 with the exception of the summing circuit 17 of Fig. 3. Amplitude detectors 15 and 16 have been modified to produce output signals of corresponding or the same polarity for the same applied input signals, and, in addition, the formerly grounded elements of each of the detectors are connected instead to a source of negative potential, —B.

As shown in Fig. 4, differential amplifier 170 is a conventional differential amplifier having a pair of input leads 171 and 172 and being responsive to signals applied to its input leads for producing an output signal on its output lead 173 corresponding to the voltage differential between its received input signals. The stage itself comprises a pair of triode electron discharge devices 174 and 175, each having a plate, grid and cathode. The plate of triode 174 is connected to ground while the plate of triode 175 is connected to a source of positive potential +B through a plate load resistor 176. The cathodes of triodes 174 and 175 are directly connected together and are returned to a source of negative potential —B through a cathode load resistor 177. An output coupling network 174 comprising a tapped voltage divider is connected between the plate of triode 175, and the —B voltage source, while the adjustable tap 178 of the voltage divider serves as the output circuit, the output signal being developed between the tap and the —B voltage source, as shown. The output terminals of detectors 15 and 16 are connected directly to the grids of each of triodes 174 and 175 respectively.

By appropriate choice of triodes 174 and 175 and the values of resistors 176 and 177, differential amplifier stage 170 may be designed in accordance with well known engineering principles to provide an output signal which is a constant multiple of the voltage differential applied to its two inputs. The resulting output signal will be linear if stage 170 is designed to operate in a linear manner over the desired range of input and output signals. The frequency response of the embodiment of the invention shown in Fig. 4 will be found to correspond in all respects to that shown and described for the embodiment of Fig. 3.

There has thus been described a frequency discriminator having a linear response for frequencies from direct current to twice a predetermined center frequency.

What is claimed as new is:

1. A frequency discriminator for receiving an applied input signal and producing an output signal that is a linear function of the frequency of the applied input signal, said discriminator comprising: a high-pass filter having an input terminal and an output terminal; means for applying the input signal to the input terminal of said high-pass filter, said input signal having a first amplitude condition; a low-pass filter having an input terminal and an output terminal; a source of potential, means coupled to said source of potential and to the input terminal of said low-pass filter for operating in parallel with said low-pass filter in response to said input signal to apply said input signal to the input terminal of said low-pass filter with a second amplitude condition having a constant fraction of the amplitude condition of the signal applied to said high-pass filter; a pair of amplitude detectors, each being connected to the output terminal of said high and low-pass filters, respectively; and a summing circuit connected to each of said amplitude detectors and responsive to signals appearing thereon for producing an output signal corresponding to the sum thereof.

2. In a frequency discriminator including a high-pass filter and a low-pass-filter, apparatus for improving the linearity of discriminator output signals with respect to the frequency of input signals of varying amplitude applied from a source comprising means coupled to said source and to said high-pass filter for applying input signals thereto, and an attenuator network coupled to said source in parallel with said low-pass filter and having an output terminal coupled to said low-pass filter for applying thereto a substantially constant fraction of the amplitude of the signals applied to said high-pass filter, the pass-bands of said high-pass and low-pass filters remaining substantially constant as the amplitude of the input signals vary.

3. The means set forth in claim 2 wherein said constant fraction of the amplitude has a value of not more than approximately one fifth.

4. A frequency discrimnator for demodulating applied input signals and producing an output signal having an amplitude which is a substantially linear function of the frequency of an input signal applied thereto from a source of input signals, said discriminator comprising: a high-pass filter having an input terminal and an output terminal and responsive to signals applied to said input terminal for producing a signal on said output terminal having an amplitude which is a direct function of the frequency of said applied input signal; a low-pass filter having an input terminal and an output terminal and being responsive to signals applied to said input terminal for producing a signal on said output terminal having an amplitude which is an inverse function of the frequency of the applied input signals; means coupled between said source of input signals and said input terminal of said high-pass filter for applying said input signals thereto to be demodulated; a potential source; means coupled between said source of input signals and said potential source and to the input terminal of said low-pass filter for developing a signal in parallel with said low-pass filter having an amplitude that is a predetermined constant fraction of the amplitude of said input signal, said signal developed in parallel with said low-pass filter being applied thereto; first and second amplitude detectors; means connecting the output of said high-pass filter to the input of said first amplitude detector; means connecting the output of said low-pass filter to the input of said second amplitude detector; and means interconnecting the output of said first and second amplitude detectors for producing an output signal corresponding to the amplitude differential of the signals appearing on the output of said high-pass and low-pass filters.

5. A frequency discriminator responsive to a source of input signals for producing output signals of a first polarity in response to input signals at a frequency greater than a preselected center frequency, and output signals of a second polarity in response to input signals of a frequency less than said center frequency, said input signals having varying amplitudes, said discriminator comprising: a high-pass RC filter network having a fixed pass-band; a low-pass RC filter network having a fixed pass-band; means coupled to said source of input signals and to said high-pass filter for applying input signals to be demodulated to said high-pass filter; a source of potential; attenuating means coupled between said source of input signals and said source of potential and to said low-pass filter network, said input signals being attenuated to approximately one fifth of the amplitude of the signals applied to the high-pass filter before being applied to said low-pass filter, the attenuation being in parallel with said low-pass filter so that the fixed pass-band of said low-pass filter is not varied with the variation in amplitude of said input signal; and means for amplitude detecting the output of each of said high-pass and low-pass filter networks and combining the detected output signals to produce an output signal corresponding to the differential thereof.

6. The frequency discriminator defined in claim 5, wherein said RC high-pass filter comprises an RC differentiating network including a resistor and capacitor and said RC low-pass network comprises an RC integrating network including a resistor and capacitor.

7. The frequency discrimnator defined in claim 5, wherein said high-pass filter includes a resistor and a capacitor having a time constant equal to $\sqrt{.33}/2\pi f_c$ and said low-pass filter comprises a resistor and capacitor having a time constant corresponding to $\sqrt{.031}/2\pi f_c$ where $f_c$ is said center frequency.

8. A frequency discriminator for responding to an input signal from an input terminal and producing an output signal at an output terminal that is a linear function of the frequency of the applied input signal, said discrimnator comprising a summing circuit coupled to said output terminal, a first signal path including a high-pass filter coupled to said input terminal and an amplitude detector coupled between said high-pass filter and said summing circuit, a source of potential, a second signal path including an attentuator coupled between said input terminal and said source of potential for developing a signal at an output terminal that has an amplitude approximately one fifth of the amplitude of the input signal, and a third signal path including a low-pass filter coupled to the output terminal of said attenuator and a second amplitude detector coupled between said low-pass filter and said summing circuit.

References Cited in the file of this patent

UNITED STATES PATENTS

| | | |
|---|---|---|
| 2,114,335 | Crosby | Apr. 19, 1938 |
| 2,413,913 | Duke | Jan. 7, 1947 |
| 2,589,133 | Purington | Mar. 11, 1952 |
| 2,737,628 | Haines | Mar. 6, 1956 |
| 2,755,383 | Mannheimer | July 17, 1956 |
| 2,899,643 | Slonczewski | Aug. 11, 1959 |

OTHER REFERENCES

Jacobs: Abst. of Ser. No. 560,560, published August 23, 1949, 625 O.G. 1108.